(12) United States Patent
Chang et al.

(10) Patent No.: US 10,383,254 B2
(45) Date of Patent: Aug. 13, 2019

(54) ELECTRONIC DEVICE

(71) Applicant: Wistron NeWeb Corp., Hsinchu (TW)

(72) Inventors: Hung-Ming Chang, Hsinchu (TW);
Yi-Yun Chang, Hsinchu (TW);
Shih-Hong Chen, Hsinchu (TW);
Babak Radi, Hsinchu (TW);
Sheng-Hung Tsai, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 0 days.

(21) Appl. No.: 15/855,545

(22) Filed: Dec. 27, 2017

(65) Prior Publication Data

US 2019/0045664 A1 Feb. 7, 2019

(30) Foreign Application Priority Data

Aug. 1, 2017 (TW) ................. 106125865 A (51) Int. Cl.
*F28D 7/00* (2006.01)
*H05K 7/20* (2006.01)
*G06F 1/20* (2006.01)
*H01L 23/367* (2006.01)
*H01L 23/373* (2006.01)

(52) U.S. Cl.
CPC .......... *H05K 7/20436* (2013.01); *G06F 1/20* (2013.01); *H01L 23/367* (2013.01); *H05K 7/20445* (2013.01); *H01L 23/373* (2013.01); *H01L 23/3736* (2013.01)

(58) Field of Classification Search
CPC .. H01L 23/04; H01L 23/3675; H01L 23/3737
USPC ........................................... 165/80.2
See application file for complete search history.

(56) References Cited

U.S. PATENT DOCUMENTS

| | | | | |
|---|---|---|---|---|
| 5,933,323 | A | * | 8/1999 | Bhatia ............... H01L 23/04 165/80.2 |
| 2016/0141223 | A1 | * | 5/2016 | Aramaki ........ H01L 23/3737 165/133 |
| 2016/0150680 | A1 | * | 5/2016 | Aramaki ........ H01L 23/3737 165/133 |
| 2016/0268179 | A1 | * | 9/2016 | Hiruta ............ H01L 23/3675 |

FOREIGN PATENT DOCUMENTS

TW     M531125     10/2016

* cited by examiner

*Primary Examiner* — David D Hwu (57) ABSTRACT

An electronic device is provided. The electronic device includes a heat source, a heat-conductive member and a heat-dissipating sheet. The heat-conductive member includes a recess, wherein the recess is thermally connected to the heat source. The heat-dissipating sheet is attached to the heat-conductive member, wherein the heat-dissipating sheet covers the recess.

20 Claims, 7 Drawing Sheets

ELECTRONIC DEVICE

CROSS REFERENCE TO RELATED APPLICATIONS

This Application claims priority of Taiwan Patent Application No. 106125865, filed on Aug. 1, 2017, the entirety of which is incorporated by reference herein.

BACKGROUND OF THE INVENTION

Field of the Invention

The present invention relates to an electronic device, and in particular to an electronic device with a heat-dissipation requirement.

Description of the Related Art

In a small electronic device without the means for active heat dissipation, the air inside the electronic device is almost motionless. The heat inside the electronic device is transmitted to the housing thereof by conduction and radiation, and then transmitted to the external environment. In an electronic device of a small size, when the distance between the heat-conductive member and the housing is small (smaller than 0.5 mm, for example), heat is transmitted from the heat-conductive member to the housing primarily by conduction, and the temperature inside the electronic device can be decreased by reducing the heat resistance therein. Conventionally, the major way to overcome heat-dissipation issues is to simply add a thermal pad or thermal paste between the heat-conductive member and the housing to reduce heat resistance, which, consequently, increases the surface temperature of the housing of the electronic device on a focused area, namely creating the so-called "hotspot".

BRIEF SUMMARY OF THE INVENTION

An electronic device is provided and includes a heat source, a heat-conductive member, and a heat-dissipating sheet. The heat-conductive member has a recess thermally connected to the heat source. The heat-conductive member has a first side and a second side opposite to the first side, in which the second side is thermally connected to the heat source. The heat-dissipating sheet is attached to the heat-conductive member and completely covers the recess and includes a contact portion, a bent portion and a wing portion. The contact portion contacts the first side and covers the recess, the bent portion is connected between the contact portion and the wing portion, and a gap is formed between at least a portion of the wing portion and the first side; a housing. The heat source, the heat-conductive member and the heat-dissipating sheet are disposed in the housing, and a second gap is formed between at least a portion of the wing portion and the housing.

In one embodiment, an electronic device is provided. The electronic device includes a heat source, a heat-conductive member and a heat-dissipating sheet. The heat-conductive member includes a recess, wherein the recess is thermally connected to the heat source. The heat-dissipating sheet is attached to the heat-conductive member, wherein the heat-dissipating sheet covers the recess.

In one embodiment of the invention, the heat-dissipating sheet covers the recess to reduce the heat resistance of the recess, and the heat-conductivity and heat-dissipation efficiency of the electronic device are therefore improved. In another embodiment, the heat resistance inside the electronic device is further decreased by the wing portion, and the heat-conductivity and heat-dissipation efficiency of the electronic device are improved further. Therefore, the heat-dissipating sheet provides sufficient heat-dissipation efficiency with decreased size.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
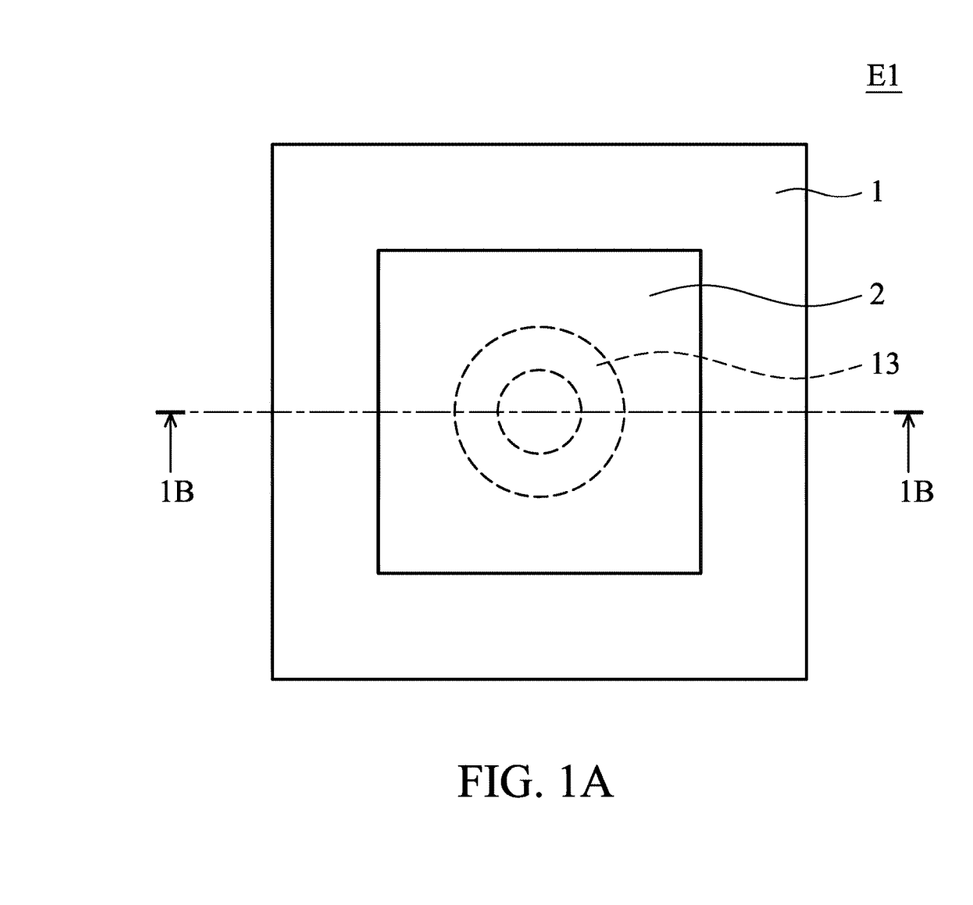
FIG. 1A is a top view of the main elements of an electronic device of a first embodiment of the invention.
Figure 1B:
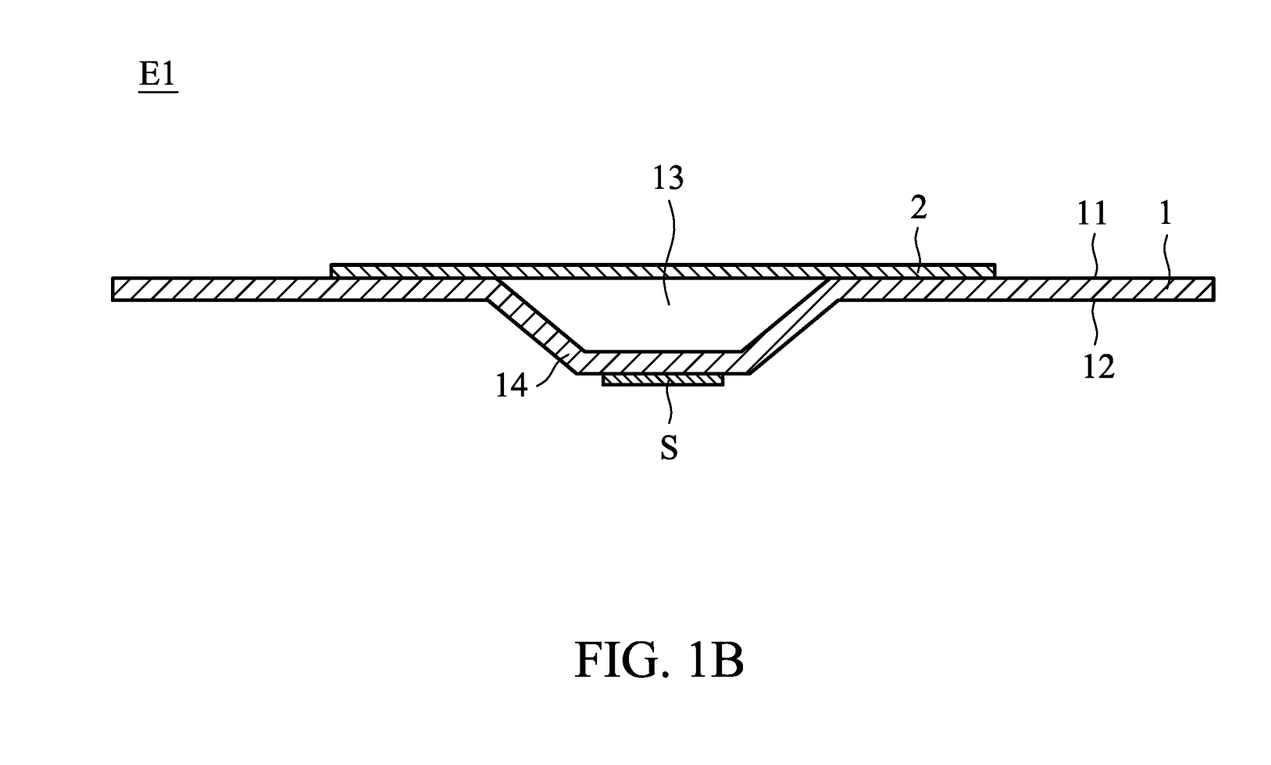
FIG. 1B is a sectional view along 1B-1B direction of FIG. 1A.

FIG. 1A is a top view of the main elements of an electronic device E1 of a first embodiment of the invention. FIG. 1B is a sectional view along 1B-1B direction of FIG. 1A. With reference to FIGS. 1A and 1B, the electronic device E1 of the first embodiment of the invention includes a heat source S, a heat-conductive member 1 and a heat-dissipating sheet 2. The heat-conductive member 1 includes a recess 13. The recess 13 is thermally connected to the heat source S. More specifically, the recess 13 can be thermally connected to the heat source S in either direct contact, or indirect contact having a thermal pad or thermal paste disposed therebetween (figure not shown). With reference to FIGS. 1A and 1B, the heat-dissipating sheet 2 is attached to the heat-conductive member 1, in which the heat-dissipating sheet 2 fully covers the recess 13.

With reference to FIG. 1A, in this embodiment, the heat-dissipating sheet 2 can be made of heat-conductive materials such as an aluminum foil, a copper foil or a graphite flake. The thickness of the heat-dissipating sheet 2 is between 0.1 mm and 0.5 mm. The heat-conductive member 1 comprises a first side 11 and a second side 12. The second side 12 is opposite to the first side 11. The recess 13 is formed as a concave portion on the first side. A protrusion 14 is formed as a convex portion on the second side 12 and corresponds to the recess 13, namely the concave portion of the first side 11. The protrusion 14 (second side 12) faces toward the heat source S. The heat-dissipating sheet 2 is attached to the first side 11.

In one embodiment, the heat source S can be a chip or another heat-generating electronic element. The heat-conductive member 1 can be a metal plate or made of other heat-conductive materials.

In the embodiment of the invention, the heat-dissipating sheet 2 covers the recess 13 to reduce the heat resistance of the recess 13, and the heat-conductivity and heat-dissipation efficiency of the electronic device are therefore improved. In one embodiment, the coverage of the heat-dissipating sheet 2 is at least greater than the widest opening area of the recess 13 to provide sufficient heat-conductivity and heat-dissipation efficiency. The heat-dissipation efficiency increases as the coverage of the heat-dissipating sheet 2 expands. In some embodiments, the heat-dissipating sheet 2 can be completely covering the first side 11 to reach higher heat-dissipation efficiency.

Figure 2A:
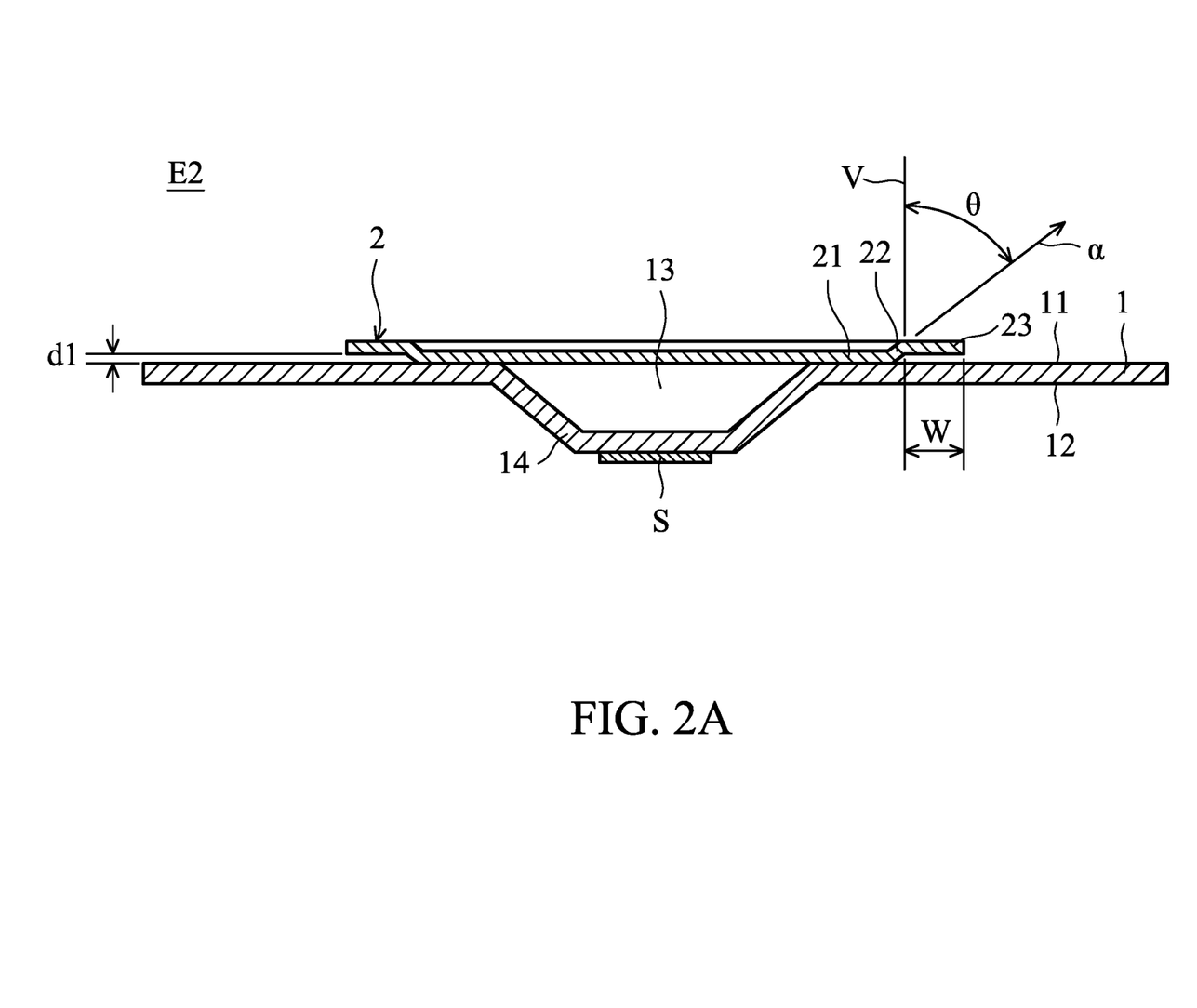
FIG. 2A is a sectional view of the main elements of an electronic device of a second embodiment of the invention.

FIG. 2A is a sectional view of the main elements of an electronic device E2 of a second embodiment of the invention. With reference to FIG. 2A, the electronic device E2 of the second embodiment of the invention includes a heat source S, a heat-conductive member 1 and a heat-dissipating sheet 2. The heat-conductive member 1 includes a recess 13. The recess 13 is thermally connected to the heat source S. The heat-dissipating sheet 2 is attached to the heat-conductive member 1, where the heat-dissipating sheet 2 covers the recess 13. In this embodiment, the heat-dissipating sheet 2 comprises a contact portion 21, a bent portion 22 and a wing portion 23. The contact portion 21 contacts the first side 11 and covers the recess 13. The bent portion 22 is connected in between the contact portion 21 and the wing portion 23. A gap d1 is formed between at least a part of the wing portion 23 and the first side 11.

Figure 2B:
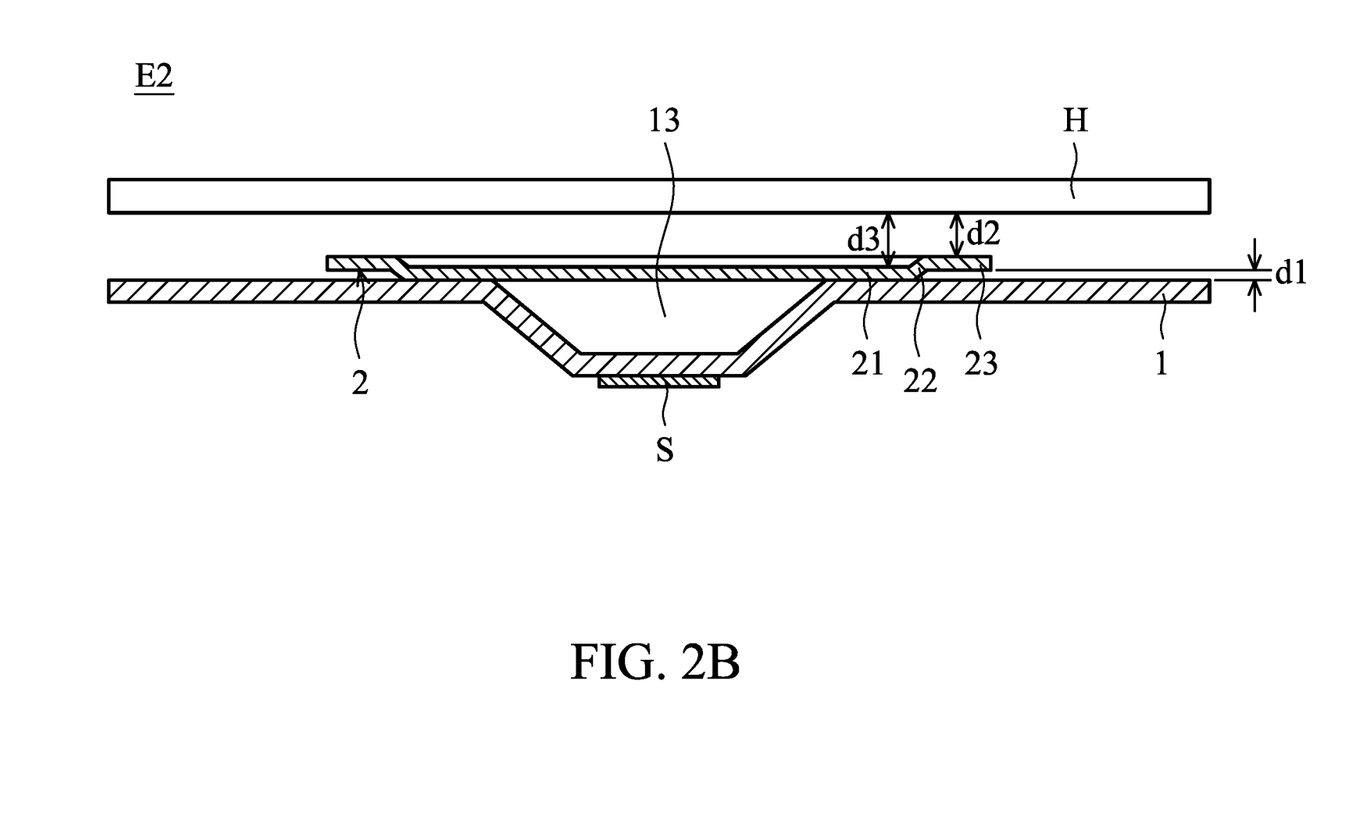
FIG. 2B shows the housing of the electronic device of the second embodiment of the invention.

With reference to FIG. 2B, in one embodiment, the electronic device E2 further includes a housing H. The heat source S, the heat-conductive member 1 and the heat-dissipating sheet 2 are disposed in the housing H. A second gap d2 is formed between at least a portion of the wing portion 23 and the housing H. In one embodiment, the first gap d1 is smaller than 1 mm, and the second gap is smaller than 0.5 mm. Similar to the first embodiment, the heat-dissipating sheet 2 of the second embodiment covers the recess 13 to reduce the heat resistance of the recess 13, and the heat-conductivity and heat-dissipation efficiency of the electronic device are therefore improved. Additionally, the heat-dissipating sheet 2 of the second embodiment has the wing portion 23. The wing portion 23 is adjacent to the housing H and is separated therefrom. The heat resistance inside the electronic device is further decreased, the heat-conductivity and heat-dissipation efficiency of the electronic device are further improved, and the hotspot is prevented from being formed on the housing H.

Figure 2C:
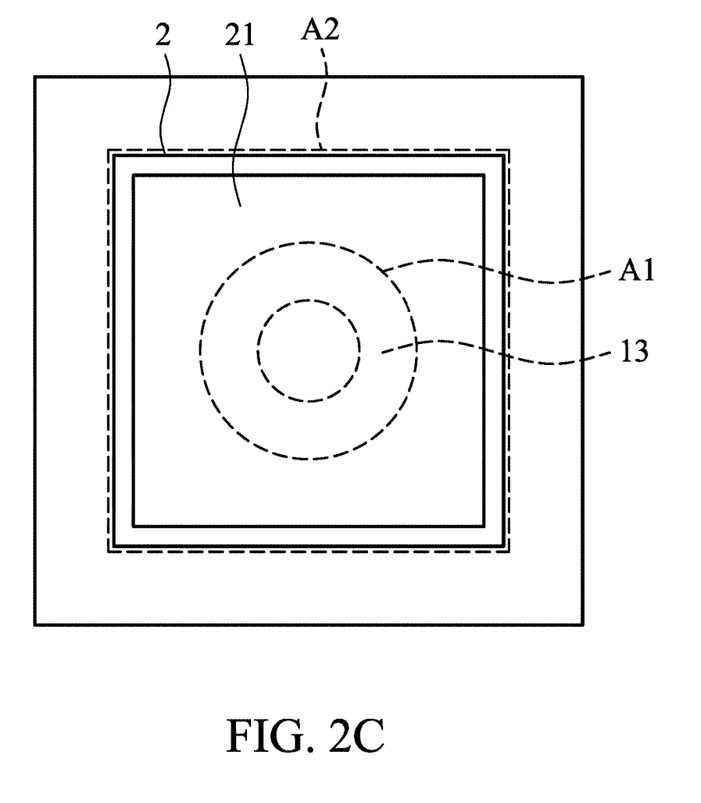
FIG. 2C is a top view of the electronic device of the second embodiment of the invention.

FIG. 2C is a top view of the electronic device E2 of the second embodiment of the invention. In one embodiment, the recess 13 has a widest opening area A1, the heat-dissipating sheet has a sheet area A2, and the ratio of the widest opening area A1 to the sheet area A2 is greater than 25%. In one embodiment, the ratio of the widest opening area A1 to the sheet area is between 30% and 45%. In this embodiment, the heat resistance inside the electronic device is further decreased by the wing portion 23, and the heat-conductivity and heat-dissipation efficiency of the electronic device are improved further. Therefore, the heat-dissipating sheet provides sufficient heat-dissipation efficiency with decreased size.

With reference to FIG. 2A, in one embodiment, the wing portion 23 extends from the bent portion 22 till an extending distance W. The extending distance W is between 0.3 mm and 1.5 mm. In another embodiment, the extending distance W can include the extending distances of the bent portion 22 and the wing portion 23. The bent portion 22 extends in an extending direction α, and an included angle θ between the extending direction α and a vertical direction V is 30 degrees. By designing the size and the position of the wing portion, the hotspot is prevented from being formed on the housing H, and the heat-dissipation efficiency of the electronic device is maintained.

With reference to FIGS. 2B and 2C, in one embodiment, a third gap d3 is formed between the contact portion 21 and the housing H, and the ratio of the second gap d2 to the third gap d3 is between 0.1 and 1. In one embodiment, the recess 13, the contact portion 21 and the heat-dissipating sheet 2 are overlapping with each other on a vertical projection plane. The recess 13 is circular on the vertical projection plane, the contact portion 21 is rectangular on the vertical projection plane, and the heat-dissipating sheet 2 is rectangular on the vertical projection plane.

Figure 3:
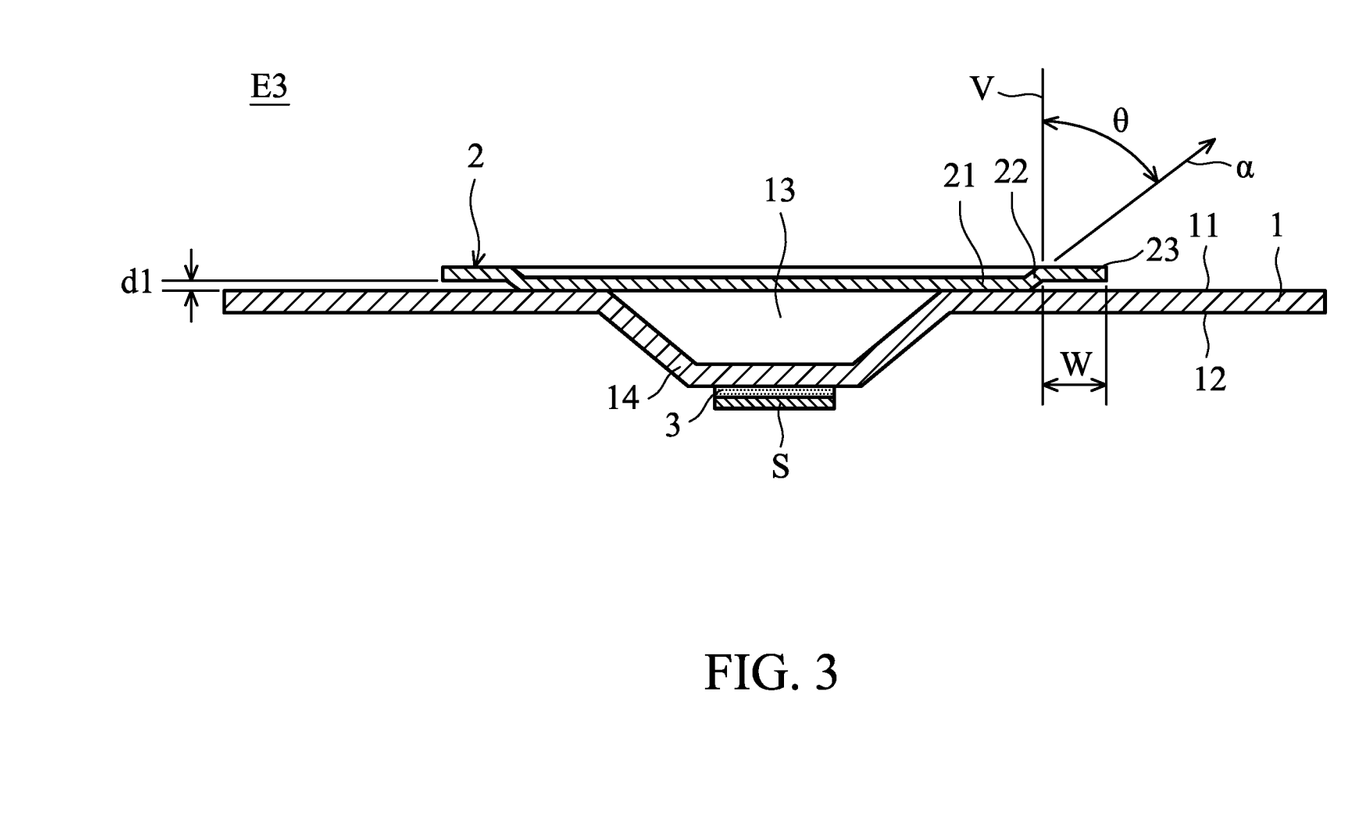
FIG. 3 shows an electronic device of a third embodiment of the invention.

Although the heat sources introduced in the aforementioned embodiments are shown being in direct contact with the second side, however, as previously mentioned, practically, the heat sources may either be in direct contact with the second side, or be thermally communicating with the second side via heat conductive materials such as a thermal pad or thermal paste, etc. FIG. 3 shows an electronic device E3 of a third embodiment of the invention. With reference to FIG. 3, the electronic device E3 of the third embodiment of the invention includes a heat source S, a heat-conductive member 1 and a heat-dissipating sheet 2. The heat-conductive member 1 includes a recess 13. The recess 13 is thermally connected to the heat source S. The heat-dissipating sheet 2 is attached to the heat-conductive member 1, where the heat-dissipating sheet 2 completely covers the recess 13. In this embodiment, the electronic device E3 further includes a thermal pad 3, the heat source S is an electronic element, and the heat conductive pad 3 is disposed between the second side 12 and the heat source S. The thermal pad 3 or the thermal paste further improves the heat-dissipation efficiency of the electronic device.

Figure 4:
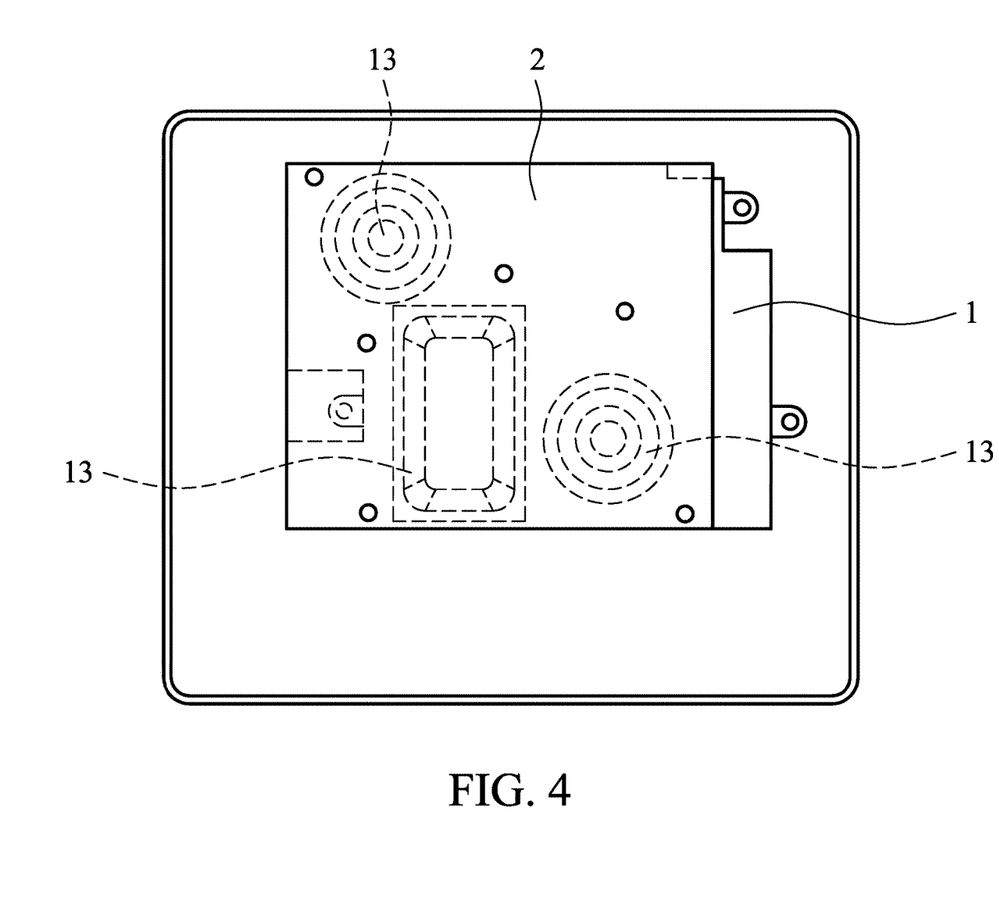
FIG. 4 shows the heat-conductive member having a plurality of recesses of another embodiment of the invention.

With reference to FIG. 4, in one embodiment, the heat-conductive member 1 has a number of recesses 13 to dissipate heat from numerous heat sources. The recesses 13 can be circular, rectangular, or another shape. The one single heat-dissipating sheet 2 can cover the recesses 13 simultaneously to reduce the heat resistance of the electronic device and to increase the heat-conductivity and heat-dissipation efficiency of the electronic device.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a heat source;
   a heat-conductive member, comprising a recess thermally connected to the heat source, wherein the heat-conductive member has a first side and a second side opposite to the first side, and the second side is thermally connected to the heat source; and
   a heat-dissipating sheet, attached to the heat-conductive member, wherein the heat-dissipating sheet completely covers the recess and comprises a contact portion, a bent portion and a wing portion, the contact portion contacts the first side and covers the recess, the bent portion is connected between the contact portion and the wing portion, and a gap is formed between at least a portion of the wing portion and the first side;
   a housing, wherein the heat source, the heat-conductive member and the heat-dissipating sheet are disposed in the housing, and a second gap is formed between at least a portion of the wing portion and the housing.

2. The electronic device as claimed in claim 1, wherein the recess has a widest opening area, the heat-dissipating sheet has a sheet area, and a ratio of the widest opening area to the sheet area is greater than 25%.

3. An electronic device, comprising:
   a heat source;
   a heat-conductive member, comprising a recess thermally connected to the heat source; and
   a heat-dissipating sheet, attached to the heat-conductive member, wherein the heat-dissipating sheet has a contact portion, a bent portion and a wing portion, the contact portion completely covers the recess, the bent portion connects the contact portion and the wing portion, and a gap is formed between at least a portion of the wing portion and the heat-conductive member.

4. The electronic device as claimed in claim 3, wherein the heat-dissipating sheet is an aluminum foil, a copper foil or a graphite flake.

5. The electronic device as claimed in claim 3, wherein the heat-conductive member comprises a first side and a second side, the second side is thermally connected to the heat source, and the heat-dissipating sheet is attached to the first side.

6. The electronic device as claimed in claim 5, wherein the contact portion contacts the first side and covers the recess, and the gap is formed between at least a portion of the wing portion and the first side.

7. The electronic device as claimed in claim 6, wherein the first gap is smaller than 1 mm.

8. The electronic device as claimed in claim 6, wherein the recess has a widest opening area, the heat-dissipating sheet has a sheet area, and a ratio of the widest opening area to the sheet area is greater than 25%.

9. The electronic device as claimed in claim 8, wherein the ratio of the widest opening area to the sheet area is between 30% and 45%.

10. The electronic device as claimed in claim 6, wherein an extending distance of the wing portion is between 0.3 mm and 1.5 mm.

11. The electronic device as claimed in claim 6, wherein an extending distance of the bent portion and the wing portion is between 0.3 mm and 1.5 mm.

12. The electronic device as claimed in claim 6, wherein the bent portion extends in an extending direction, and an included angle between the extending direction and a vertical direction is 30 degrees.

13. The electronic device as claimed in claim 6, further comprising a housing, wherein the heat source, the heat-conductive member and the heat-dissipating sheet are disposed in the housing, and a second gap is formed between at least a portion of the wing portion and the housing.

14. The electronic device as claimed in claim 13, wherein the second gap is smaller than 0.5 mm.

15. The electronic device as claimed in claim 13, wherein a third gap is formed between the contact portion and the housing, and a ratio of the second gap to the third gap is between 0.1 and 1.

16. The electronic device as claimed in claim 6, wherein the recess, the contact portion and the heat-dissipating sheet are overlapping with each other on a vertical projection plane, the recess is circular on the vertical projection plane, the contact portion is rectangular on the vertical projection plane, and the heat-dissipating sheet is rectangular on the vertical projection plane.

17. The electronic device as claimed in claim 3, wherein a thickness of the heat-dissipating sheet is between 0.1 mm and 0.5 mm.

18. An electronic device, comprising:
    a heat source;
    a heat-conductive member, comprising a recess, wherein the recess is thermally connected to the heat source;
    a heat-dissipating sheet, attached to the heat-conductive member, wherein the heat-dissipating sheet covers the recess; and
    a thermal pad,
    wherein the heat-conductive member comprises a first side and a second side, the second side is thermally connected to the heat source, the thermal pad is disposed between the second side and the heat source, and the heat-dissipating sheet is attached to the first side,
    wherein the heat-dissipating sheet comprises a contact portion, a bent portion and a wing portion, the contact portion contacts the first side and covers the recess, the bent portion connects the contact portion and the wing portion, and a gap is formed between at least a portion of the wing portion and the first side.

19. The electronic device as claimed in claim 18, wherein the first gap is smaller than 1 mm.

20. The electronic device as claimed in claim 18, wherein the recess, the contact portion and the heat-dissipating sheet are overlapping with each other on a vertical projection plane, the recess is circular on the vertical projection plane, the contact portion is rectangular on the vertical projection plane, and the heat-dissipating sheet is rectangular on the vertical projection plane.

* * * * *